United States Patent
Krijnen

(10) Patent No.: US 7,352,472 B2
(45) Date of Patent: Apr. 1, 2008

(54) LITHOGRAPHIC APPARATUS, DEVICE MANUFACTURING METHOD, AND METHOD FOR DETERMINING Z-DISPLACEMENT

(75) Inventor: Edwin Eduard Nicolaas Josephus Krijnen, Oss (NL)

(73) Assignee: ASML Netherlands B.V., Veldhoven (NL)

( * ) Notice: Subject to any disclaimer, the term of this patent is extended or adjusted under 35 U.S.C. 154(b) by 254 days.

(21) Appl. No.: 10/779,864

(22) Filed: Feb. 18, 2004

(65) Prior Publication Data

US 2005/0179909 A1 Aug. 18, 2005

(51) Int. Cl.
*G01B 11/14* (2006.01)

(52) U.S. Cl. ...................................... 356/500

(58) Field of Classification Search ................ 356/482, 356/486, 493, 498, 500, 509, 510
See application file for complete search history.

(56) References Cited

U.S. PATENT DOCUMENTS

| | | | |
|---|---|---|---|
| 5,229,872 A | | 7/1993 | Mumola |
| 5,296,891 A | | 3/1994 | Vogt et al. |
| 5,523,193 A | | 6/1996 | Nelson |
| 5,801,832 A | * | 9/1998 | Van Den Brink ........... 356/500 |
| 5,969,441 A | | 10/1999 | Loopstra et al. |
| 6,020,964 A | * | 2/2000 | Loopstra et al. ............ 356/500 |
| 6,046,792 A | | 4/2000 | Van Der Werf et al. |
| 6,122,036 A | * | 9/2000 | Yamasaki et al. ............. 355/53 |
| 6,285,444 B1 | * | 9/2001 | Osanai et al. ................. 355/72 |
| 6,285,457 B2 | * | 9/2001 | Ukaji .......................... 356/500 |
| 6,819,433 B2 | * | 11/2004 | Takai et al. ................. 356/500 |
| 6,875,992 B2 | * | 4/2005 | Castenmiller et al. ...... 250/548 |
| 6,876,453 B2 | * | 4/2005 | Van Doren et al. ......... 356/498 |
| 7,158,236 B2 | * | 1/2007 | Schluchter .................. 356/500 |

FOREIGN PATENT DOCUMENTS

WO  WO 98/40791  9/1998

OTHER PUBLICATIONS

Peggs et al, Design for a Compact High-Accuracy CMM, CIRP Annals, vol. 48/1, Jan. 1999, pp. 417-421.*

* cited by examiner

*Primary Examiner*—Samuel A. Turner
(74) *Attorney, Agent, or Firm*—Pillsbury Winthrop Shaw Pittman LLP

(57) ABSTRACT

The present invention provides an apparatus and method for determining displacement along the z-direction of an object, which is fixed in a holder of an apparatus and is illuminated by a beam of radiation, the beam being provided by the apparatus and having an optical axis extending in the z-direction. The method comprises arranging the measuring mirror(s) and/or measuring laser beam of an interferometer system such that no relevant part of the laser beam is parallel to the z-direction. This ensures that the interferometer system and its parts may be arranged away from the beam of radiation, allowing larger diameter projection systems for the beam of radiation, as well as more homogeneous air showers around the object. Thus the quality of the illumination of the object may be improved.

24 Claims, 5 Drawing Sheets

LITHOGRAPHIC APPARATUS, DEVICE MANUFACTURING METHOD, AND METHOD FOR DETERMINING Z-DISPLACEMENT

BACKGROUND OF THE INVENTION

1. Field of the Invention

The present invention relates to lithographic apparatus having the capability of determining the displacement of an object within the apparatus along the z-direction.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

Generally, such apparatus include an illumination system for supplying a projection beam of radiation, a support structure for supporting the patterning device, a substrate holder for holding a substrate, and a projection system for projecting the patterned beam onto a target portion of the substrate. More information with regard to lithographic devices as here described can be gleaned, for example, from U.S. Pat. No. 6,046,792, incorporated herein by reference.

The term "patterning device" as employed herein should be broadly interpreted as referring to a mechanism that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain location point points, specifically direct itself to examples involving a mask and mask table; however, the general principles discussed in such instances should be seen in the broader context of the patterning device as set forth above.

In general, a single wafer will contain a whole network of adjacent target portions that are successively irradiated via the projection system, one at a time. In current apparatus, employing patterning by a mask on a mask table, a distinction can be made between two different types of machine. In one type of lithographic apparatus—commonly referred to as a wafer stepper—each target portion is irradiated by exposing the entire mask pattern onto the target portion in one go. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, typically, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic apparatus, the pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In the state of the art, there are known lithographic projection systems which employ an interferometer system to determine a displacement in a z-direction of an object that extends in an x-y plane. For example, U.S. Pat. No. 6,020,964 discloses a lithographic projection system, where a projection beam travels in the z-direction, and where the interferometer system for determining the z-displacement comprises a mirror fixedly connected to the substrate table under an angle of 45° with the x-y plane, a reference z mirror having a mirror surface which extends in an x-y plane above the substrate table, as well as a laser beam incident horizontally on the 45° mirror and directed vertically to the z reference mirror. The z reference mirror will reflect the laser beam back to the 45° mirror, and further back towards a photodetector to determine an interference signal, from which a displacement in z direction may be determined.

A disadvantage of this lithographic projection system is the presence of the z reference mirror. The z reference mirror is located above the 45° mirror in the direction of the projection beam, thereby, restricting the space for the projection lens and/or the projection beam. There is a tendency for projection lenses to become increasingly larger in diameter, due to demands for a larger numerical aperture and higher lens quality.

Furthermore, in many lithographic projection systems, there is purging process that is initiated with an air shower. Due to thermal considerations, this air shower will almost always be directed downwards, i.e. also parallel to the projection beam. Any object near the projection beam will then obstruct the air shower, which is undesirable.

U.S. Pat. No. 6,285,444 discloses a positioning system in which the 45° mirror is tilted into a position with a different angle than 45°, such that a horizontally incident measuring laser beam is reflected away from the z-axis. Although this known system partly overcomes the problem of restricted space for the projection lens and/or the projection beam, this system still has disadvantages in certain respects. Not only will the required separate z-reference mirror still be present in the air shower, but the system also always requires two (or more) mirrors in order to determine z-displacement.

SUMMARY OF THE INVENTION

The principles of the present invention, as embodied and broadly described herein, provide a method determining the displacement of an object in a direction of the optical axis of a beam of radiation, wherein the above identified disadvantages are overcome, and in particular, the presence of objects in the vicinity of the projection lens and beam are minimized. In one embodiment, the method comprises providing a reference laser beam and a measuring laser beam, such that the measuring laser beam is substantially retro-reflected and at least partly comes to overlap the reference beam at a signal receiving and processing system, thereby providing an interference signal, determining a change in the interference signal, and processing the change in order to determine the displacement in the z-direction. The measuring laser beam is directed to be substantially perpendicularly incident on a measuring mirror with a fixed position with respect to the object, a normal to the measuring mirror making a non-zero acute angle with the z-direction.

In particular, there is provided a method for determining a displacement in a z-direction, of an object in an apparatus, wherein the object has a surface which extends substantially in a plane perpendicular to the z-direction and which is illuminable by a beam of radiation, the beam provided by the apparatus and having an optical axis extending in the z-direction, wherein the method comprises providing an interferometer system containing a laser beam generator system arranged and constructed for providing at least one reference laser beam and at least one measuring laser beam, a set of at least one mirror, wherein at least one mirror of the set is a measuring mirror with a fixed position with respect to the object and having a mirror surface, the normal to which makes a non-zero acute angle with the z-direction and an interference signal receiving and processing system, arranged and constructed for receiving an interference signal produced by the reference laser beam and the measuring laser beam, and for determining the displacement on the basis of a change in the interference signal. The method further comprises providing a reference laser beam and a measuring laser beam, wherein the measuring laser beam is directed towards the measuring mirror in a direction substantially perpendicular to the mirror surface, such that the measuring laser beam is substantially retro-reflected by the measuring mirror and at least partly overlaps the reference beam at the signal receiving and processing system, thereby providing the interference signal, displacing the object in the apparatus, determining a change in the interference signal, and processing the change in order to determine the displacement in the z-direction.

The method according to the invention allows the determination of a z-displacement without any part other than the measuring mirror being present in or near (an optical axis of) a beam of radiation or an air shower. Hence, on the one hand, the projection lens, or other parts of the projection system, may be made larger and more precise, on the other hand the flow of air in the air shower will be much more homogeneous, which is beneficial not only for e.g. illumination of the object, but also e.g. for the accuracy of the interferometer system, which may be flushed with a homogeneous flow of conditioned air, having well known optical properties.

The method of the present invention relates to determination of a z-displacement in an apparatus, by means of an interferometer system, in which apparatus an object is illuminable by a beam of radiation. The object may be a single unit, or may be a composite object, such as a partial object which is fixed in or on a holder of the apparatus, e.g. a wafer on a wafer table. Note that, throughout this application, determining a z-displacement allows determining a z-position as well, as soon as a z-reference position is determined. To this end, e.g. one or more reference markers are often provided on the object or the holder.

In principle, the method of the present invention may be used in any apparatus in which displacements are measured with interferometer systems. However, in particular, said apparatus is a lithographic apparatus, and said beam of radiation is a patterned projection beam of radiation for imparting a photolithographic pattern or structure to the object, since demands as to accuracy are very strict with lithographic apparatus. Another possibility could be a beam of radiation for measuring a property of said object, e.g. height map of a wafer surface. Herein, said beam of radiation for measuring a property may be a laser beam. However, in the present application, the term 'measuring laser beam' is intended to mean the laser beam in the interferometer system, used to determine displacement.

Note that in the present application, the z-direction is taken as the direction of the optical axis of the beam of radiation. This need not be the z-direction of everyday life, i.e. the vertical direction. In other apparatus, the z-direction may be e.g. a horizontal direction. In the present context, the z-direction is taken as the direction of the optical axis of the beam of radiation.

The interferometer system of the present invention may comprise elements and features known in the state of the art. In particular, details which do not relate to the thrust of the present invention are discussed only briefly, since the skilled person will easily provide for them. For example, the laser beam generator may comprise a simple laser source, providing a laser beam which is split in the desired number of reference laser beams and measuring laser beams by means of one or more beam splitters.

The reference laser beam(s) may be (retro)reflected by means of e.g. a reference mirror in a fixed position and perpendicular with respect to said laser beam. After the measuring laser beam and the corresponding reference laser beam have been reflected by the associated mirror(s), said beams will be combined onto a photodetector which is constructed to be sensitive for the interference pattern produced by the combined beams. The photodetector is part of the pattern receiving and processing system, which processes the received interference pattern and converts it into an actual displacement, by means of mathematical formulae. Herein, conditions like temperature of the air, angles of incidence, paths traversed by the various beams, etc. may be taken into account. This is however a standard practice for the skilled person, and details will only be discussed where deemed appropriate for a better understanding.

In the apparatus according to the invention, the measuring mirror is arranged substantially perpendicularly with respect to the measuring laser beam incident on said measuring mirror. In this case, there is only one physical mirror, performing both functions, i.e. both that of the measuring mirror and that of retro-reflecting. In this apparatus the number of mirrors in the set of mirrors is reduced to a minimum of one mirror, which reduces not only cost, but also increases accuracy of the method. Note that the set of mirrors may comprise additional mirrors, e.g. located at positions along the path of the measuring beam between the laser beam generator and the measuring mirror. Such additional mirror(s) may e.g. be useful for guiding a measuring laser beam towards the measuring mirror.

In principle, the measuring mirror may be a retro-reflector. This offers a very simple way of combining both functions in one reflector, which is (much) less sensitive to exact alignment of the measuring laser beam. As used in this application, the term "retro-reflector" is intended to mean an object with a surface that is able to reflect an incident beam back in the same direction as from which it is incident, regardless of that direction, or at least for a large range of incident directions. An example may be a corner cube, or a foil comprising a collection of adjacent corner cubes. This embodiment may be useful for measuring very small displacements.

In practical lithographic apparatus, the displacements to be measured are so large, e.g. more than 300 mm, that a perpendicularly reflecting (plane) mirror offers advantages over a retro-reflector, which would become too large and too heavy. Hence, advantageously, the measuring mirror is arranged substantially perpendicularly with respect to the measuring laser beam incident on said measuring mirror. Although this embodiment offers the same combination of measuring and retro-reflecting functions in one mirror, a further advantage is provided in that the planeness of the actually reflecting mirror surface may be made much better than that of a retro-reflector, which is inherently structured. This holds in particular for retro-reflectors comprising a plurality of adjacent corner-cubes.

Note that, in this application, the term "reflector" comprises both a mirror and a retro-reflector as described above, and that the term "retro-reflecting" is not only used for the property of a retro-reflector, but also for that of a mirror when a beam is incident perpendicularly. In this latter situation the beam is also retro-reflected, but obviously this only holds for a perpendicular beam.

U.S. Pat. No. 5,801,832 discloses an interferometer system comprising a mirror which is fixed to the object (or holder) under a non-zero acute angle, an interferometer beam being perpendicularly incident on the mirror. However, this system is strictly constructed and arranged for measuring displacement in the x-y plane. No part of the system is constructed and arranged to determine a z-displacement from this interferometer signal, and no hint or suggestion is given that said system could be used for measuring displacements in the z-direction. Note that in this known system, z-displacements are measured by means of a projection beam focus error detection system with a separate beam, not related to the laser beam and the slanted mirror. An additional disadvantage of the latter measuring system is that the separate beam must be reflected by the surface of the object (e.g. wafer).

Hence it is not possible to determine a z-position or z-displacement when the center axis of the projection beam, and hence the additional beam, is not incident on the object. The present invention allows determination of z displacement, and hence of z position when a reference is known, even when the projection beam is not incident on the surface. Particular advantages with respect to increased possibilities for illuminating the surface will be discussed in connection with the description of the preferred embodiments.

Advantageously, the measuring mirror is arranged such that a normal to said measuring mirror contains an angle $\alpha$ with respect to the z-direction, wherein $\alpha$ is between about 60° and about 87°. This range of angles ensures that the measuring laser beam, both incident and reflected, may be directed under an angle which makes the method sufficiently sensitive for displacement in the z-direction, in other words that the mirror is not positioned almost parallel with the z direction. Furthermore, these angles ensure that the laser beams may be incident in a sufficiently slanting direction, such that they move away from the vicinity of the beam of radiation or, in other words, of the z-direction. Note that this latter remark holds especially for the embodiments with a mirror and a perpendicularly incident measuring laser beam.

In an even more advantageous embodiment, α is between about 75° and about 85°. This takes into account that in many cases the object to be illuminated will be a thin and substantially flat object. In other words, its dimension in the z-direction will be much smaller than those in the two perpendicular directions. Shifts in the latter two directions will generally also be much larger than those in the z-direction. The preferred range of angles offers a good compromise between required dimensions of the measuring mirror on the one hand and on the other hand the sensitivity and sufficiently slanting direction of the beams as mentioned above. Still, in other cases it is possible to use other non-zero acute angles for α.

Throughout this present description, an angle between a line and a plane is intended to mean the smallest angle therebetween. Similarly, an angle between two intersecting or crossing lines is the smallest of the possible angles therebetween. Furthermore, an angle between a line or a plane and a direction, ex. a z-direction, is taken to be the angle between said line or said plane and a line in said direction.

In the above embodiment, the mirror (or retro-reflector) may be facing towards or away from the beam of radiation. In other words, the normal to the surface of the mirror or retro-reflector may point in the direction of positive z values, or of negative z values. Downward pointing beams, as seen from the measuring mirror, are in general easier to accommodate in a typical lithography machine, yet in other apparatus upward pointing beams may be preferable. In fact, they are advantageous in order to minimize Abbe-errors, as will be explained herein below.

The invention also provides a method for determining a displacement in a z-direction, of an object in an apparatus, wherein the object has a surface which extends substantially in a plane perpendicular to said z-direction and which is illuminable by a beam of radiation, said beam being provided by the apparatus and having an optical axis extending in the z-direction, wherein the method comprises providing an interferometer system which comprises a laser beam generator system arranged and constructed for providing at least one reference laser beam and at least one measuring laser beam, a set of at least two mirrors, comprising at least one mirror which is a measuring mirror fixedly connected to said object and having a mirror surface, the normal to which makes a non-zero acute angle with said z-direction, as well as at least one separate mirror having a fixed position with respect to the apparatus, and an interference signal receiving and processing system, arranged and constructed for receiving an interference signal produced by said reference laser beam and said measuring laser beam, and for determining said displacement on the basis of a change in said interference signal. The method further includes providing a reference laser beam and a measuring laser beam, wherein the measuring laser beam is directed towards said measuring mirror, such that the measuring laser beam is reflected by said measuring mirror towards said separate mirror in a direction substantially perpendicular to said separate mirror, and comes to overlap at least partly the reference beam at the signal receiving and processing system, thereby providing said interference signal, displacing said object in the apparatus, determining changes in said interference signal, and processing said changes in order to determine said displacement in the z-direction, wherein said measuring laser beam is directed to be incident on said measuring mirror outside a plane in which the z-direction and a normal to said measuring mirror lie.

This embodiment ensures that the measuring laser beam, both incident and reflected, will not be parallel with the z-direction. The separate mirror may be a mirror positioned perpendicularly with respect to the beam incident thereon.

In another advantageous method, said measuring laser beam is directed to be incident on the measuring mirror in a plane in which the z-direction and a normal to said measuring mirror lie, and under an angle with respect to said normal which differs from an angle between the z-direction and said normal, there being provided a separate mirror constructed and arranged for retro-reflecting said measuring laser beam. When the measuring laser beam happens to lie in a plane perpendicular to the measuring mirror and in the z-direction, it suffices when the angle of incidence differs from that of the z-direction to ensure that the measuring laser beam is not parallel with the z-direction. The separate mirror may be a mirror positioned perpendicularly with respect to the beam incident thereon.

Note that the above method may be used in retrofitting existing equipment. In particular, many existing object holders have a mirror block comprising a 45° mirror, which is used for directing a horizontal z measuring beam upwards towards a horizontally extending z reference mirror. By redirecting the incident measuring laser beam such that it is incident under an angle different from 45°, or such that it is no longer in the plane of the z-direction and the normal to the 45° mirror, it is ensured that no part of the measuring laser beam that is incident on the measuring mirror is parallel with the z-direction. This allows a possible separate retro-reflecting reflector, e.g. a perpendicular mirror, to be located away from the projection lens and air showers.

Advantageously, the measuring laser beam is directed such that the distance between a point where the optical axis of the beam of radiation intersects said surface of the object which is to be illuminated by the beam of radiation, and a line coincident with an optical axis of a part of the measuring laser beam that is incident on the measuring mirror is less than 6 mm. This measure ensures that the sensitivity for tilt of the object is decreased. Ordinarily, when displacement along an axis is measured along a line parallel to said axis but displaced with respect to said axis, then measuring said displacement is sensitive to errors due to tilt of the object (Abbe-errors). E.g., in the present case, if the object is shifted in the z-direction while at the same time a tilt around an axis perpendicular to both optical axes occurs, such that the change in the path length for the measuring laser beam is compensated, the net shift in z-direction for many or even most parts of the object may be non-zero, or at least measured incorrectly. To avoid this inaccuracy, it is advantageous to direct the measuring laser beam towards the point of rotation of the object with respect to the apparatus, and advantageously towards the point where the z-information is preferably determined, e.g. the point where the optical axis of the beam of radiation intersects said surface of the object which is to be illuminated by the beam of radiation.

In particular, a line coincident with an optical axis of the part of the measuring laser beam that is incident on the measuring mirror is preferably directed towards within 6 mm, and more preferably within 3 mm, of said point of rotation. Due to symmetry considerations, this is in most cases the point where, in a central position of the object in a lithographic apparatus, the optical axis of the beam of radiation, e.g. projection beam, is incident on the object to be illuminated. Most preferably, the measuring laser beam intersects the optical axis at said point, i.e. the distance is substantially zero.

Advantageously, at least one additional displacement is determined, wherein the interference signal receiving and processing system uses said additional displacement in determining the displacement in the z-direction. This embodiment is e.g. advantageous for cases in which the object, or the holder, is displaced in a direction not coincident with the z-direction. In that case, it may be taken into account that a displacement of the object in e.g. a direction perpendicular to the z-direction may cause the measuring mirror to be displaced, and hence the path length for determining the z-displacement to be changed, without there being an actual z-displacement. By actually measuring an additional displacement, this additional displacement may be taken into account when calculating the actual z-displacement. The additional displacement(s) may be determined by means of the apparatus already provided, e.g. by carrying out consecutive measurements. Alternatively, they may be determined by means of an additional displacement measuring system, such as an additional interferometer system, or any other known displacement measurement system.

Embodying the measuring of additional displacement(s) is itself known in the state of the art, and will be elucidated only briefly. E.g., a displacement in x-direction may be determined, and the effect that this displacement has on the path length of the measuring laser beam for determining the z-displacement may then be calculated. This (positive or negative) change may be added to the measured change in path length, from which the actual z-displacement may be determined.

It is possible to select the additional displacement(s) from displacement in the two perpendicular directions, or at least two different directions that each may, but need not differ from the z-direction, tilt (or rotation) in said directions and tilt (or rotation) in the z-direction. These displacements may be determined in any suitable way, for example, but not exclusively, by means of additional interferometer systems. Tilt (or rotation) may e.g. be determined by measuring displacement at two different points on one and the same mirror, taking their mutual distance into account.

Furthermore, it is possible to measure z-displacement and e.g. x-displacement by using two slanted measuring mirrors as well as two obliquely incident measuring laser beams, according to the invention, such that the two mirrors include an angle between each other.

In another embodiment, there may be provided a measuring mirror according to the invention on two opposite sides of the object, or holder. This leads to a more sensitive z-determination, and it is easier to manage possible tilts of the object.

Furthermore, it is possible to combine two or more mirror surfaces into one mirror, such as a first measuring mirror according to the invention which contains an angle with the z-direction, and a second measuring mirror for measuring an x-displacement which mirror is parallel with the z-direction. These mirrors may be connected to form one large interconnected mirror surface. In each case, one or more measuring laser beams may be associated with the respective mirrors.

All additional features of this paragraph will be known to the skilled person, who will have no difficulty embodying the actual details. Some of the above embodiments will be further elucidated in the description of the preferred embodiments.

In a further aspect of the invention, there is provided a lithographic apparatus, comprising a projection system, constructed and arranged for providing a beam of radiation for illuminating an object, the beam of radiation having an optical axis in a z-direction, a movable holder which is constructed and arranged for fixedly holding said object, an interferometer system constructed and arranged for determining a displacement of said object in a z-direction, the interferometer system comprising a laser beam generator system arranged and constructed for providing at least one reference laser beam and at least one measuring laser beam, a set of at least one mirror, wherein at least one mirror of said set is a measuring mirror with a fixed position with respect to said holder and having a mirror surface, the normal to which makes a non-zero acute angle with said z-direction, an interference signal receiving and processing system, arranged and constructed for receiving an interference pattern produced by said reference laser beam and said measuring laser beam, and for determining said displacement on the basis of a change in said interference signal, wherein said normal to said mirror surface is substantially parallel to a direction of incidence of said measuring laser beam on said mirror surface.

This lithographic apparatus is very well suited for carrying out the method of the invention. In particular, this apparatus allows determining displacements of the object (the holder, respectively) in z-direction with a sufficient distance between any part of the interferometer system (apart from the measuring mirror on the holder) and the projection system. This offers the possibility of providing larger projection systems, in particular larger projection lenses with a larger diameter.

Note that in particular the projection system may comprise a system constructed and arranged for providing a patterned beam of radiation in order to impart a photolithographic pattern or structure to an object. In some other cases, it may also comprise e.g. a system constructed and arranged for providing a beam for measuring a property of an object, such as a surface roughness. All such systems will be called projection system for simplicity's sake.

In general, most of the advantageous lithographic apparatus according to the invention provide much the same advantages as have already been described in connection with the method of the invention. Hence they will only be stated briefly here.

Advantageously, the lithographic apparatus further comprises a holder mover system, constructed and arranged for moving said holder, wherein said holder mover system is operatively connected to said interferometer system. It is advantageous to couple the holder mover system and the interferometer system in order to be able to use the determined z-displacement for moving the holder (or the object). In particular, the holder mover system is controllable by said interferometer system, at least with respect to moving of said holder and said z-direction. This obviates the need for a separate device for moving the holder in the z-direction, or control thereof, such as a device to determine z-position by means of deviations from an in-focus position.

The measuring mirror is arranged substantially perpendicularly with respect to the direction of incidence of the measuring laser beam on said measuring mirror. Only one physical mirror need be provided. Such a mirror may be provided with an extremely flat surface. Herein, the expression 'substantially perpendicularly' should be interpreted as incident on said measuring mirror under an angle of maximum about 20 millirad with the normal to said measuring mirror. The value of 20 millirad depends on the path length and beam diameter. A more general expression would be that the incident measuring laser beam and the retro-reflected measuring laser beam overlap at least partly at the photodetector. A useful equation then becomes 4 * (angle with the normal)* L≦seam diameter, or that the measuring beam laser is incident at such an angle that the retro-reflected measuring laser beam keeps at least partially overlapping the reference beam at the photodetector position, for the relevant displacements of the object/holder. It is thus ensured that the interferometer system is always able to perform its function. Although only one measuring mirror need be provided, additional mirrors are possible, e.g. for guiding the measuring laser beam from a source towards the holder/object.

Advantageously, the measuring mirror is arranged such that a normal to said measuring mirror contains an angle α with respect to the z-direction, wherein α is between about 60° and about 87°, more advantageously between 75° and 85°. These ranges provide sufficient sensitivity for displacement in the z-direction and a reasonable moving range in (in this case e.g.) the X direction and a reasonable height of the holder/mirror. This relates to the common flat shape of many practical holders extending in the x-y plane. However, in other cases it is allowable to have other angles, for example smaller angles such as around 45°, e.g. when the holder and or the stroke (maximum displacement) in x-y direction is relatively small when compared with the path length of the measuring laser beam.

The invention also provides a lithographic apparatus, comprising a projection system, constructed and arranged for providing a beam of radiation for illuminating an object, the beam of radiation having an optical axis in a z-direction, a movable holder which is constructed and arranged for fixedly holding said object, an interferometer system constructed and arranged for determining a displacement of said object in a z-direction, the interferometer system comprising a laser beam generator system arranged and constructed for providing at least one reference laser beam and at least one measuring laser beam, a set of at least one mirror, wherein at least one mirror of said set is a measuring mirror with a fixed position with respect to said holder and having a mirror surface, the normal to which makes a non-zero acute angle with said z-direction, an interference signal receiving and processing system, arranged and constructed for receiving an interference pattern produced by said reference laser beam and said measuring laser beam, and for determining said displacement on the basis of a change in said interference signal, wherein said measuring laser beam has a direction of incidence on the measuring mirror outside a plane in which the z-direction and said normal to said mirror surface lie, there being provided a separate mirror constructed and arranged for substantially retro-reflecting said measuring laser beam.

In another advantageous lithographic apparatus, the measuring laser beam has a direction of incidence on the measuring mirror that lies in a plane in which the z-direction and a normal to said measuring mirror lie, and that contains an angle with respect to said normal which differs from an angle between the z-direction and said normal, there being provided a separate mirror constructed and arranged for retro-reflecting said measuring laser beam. In both cases, the measuring laser beam will not be parallel with the z-direction, thus ensuring that parts of the interferometer system, such as an additional, retro-reflecting mirror, may be located away from the projection system. These two apparatus are useful for a measuring mirror under 45° with the z-direction, for example for retrofitting existing equipment.

Advantageously, the measuring laser beam has a direction such that the distance between a point where the optical axis of the beam of radiation intersects said surface of the object which is to be illuminated by the beam of radiation, and a line coincident with an optical axis of the part of the measuring laser beam that is incident on the measuring mirror is less than 6 mm, preferably less than 3 mm, and most advantageously substantially zero. In said point of intersection, the so-called Abbe-arm is less than 6 mm, less than 3 mm, substantially zero, respectively, and hence the Abbe-errors are as small as possible. More generally, the distance to the point of rotation of the object should be correspondingly small, but in most cases this point of rotation will be taken as the intersection of the optical axis of the beam of radiation and the illuminated surface of the object. This point is also called the focus point, as it corresponds to the intersection of the optical axis of the beam of radiation and the focal plane. Note that in principle the point of rotation may be selected arbitrarily, as a rotation around a first point is mathematically the same as a combination of a rotation around a different second point and a translation. Since translations are considered and measured anyway, it is allowable to always take the said focus point as the rotation point, although as said this is not necessary.

An advantageous lithographic apparatus according to the invention further comprises an additional displacement measuring system constructed and arranged for determining an additional determining displacement in at least one additional direction, wherein the interference signal receiving and processing system has been arranged and constructed to use said additional displacement in determining the displacement in the z-direction. Note, however, that it is not necessary to provide one or more additional displacement measuring systems for the apparatus according to the invention to be able to determine more than one displacement. This it may do by e.g. carrying out two or more measurements consecutively, changing a direction of measurement if desired.

As discussed above, providing one or more additional displacement measuring systems allows the object to be displaceable in one or more other directions than the z-direction, and still allows the apparatus, or better the processing system, to be able to determine a z-displacement. Such an additional displacement measuring system may be any known displacement measuring system, such as a capacitive displacement measuring system or an encoder. Of course, it is also possible to determine displacements in other directions per se.

Advantageously, the additional displacement measuring system is an additional interferometer system. This allows accurate results, and may furthermore easily be combined with the interferometer system for determining z-displacement as used in the invention. Hence, advantageously, the interferometer system is constructed and arranged for determining at least one additional displacement, e.g. selected from a displacement in x-direction, a displacement in y-direction, a rotation in a plane perpendicular to an x axis, a rotation around an x-direction, a rotation around a y-direction and a rotation around a z-direction, wherein the interference signal and processing system is constructed and arranged to convert a combination of said optical signal and the at least one additional displacement into a value for the z-displacement. Herein, the x-direction and the y-direction have their usual meanings of two orthogonal directions, each also orthogonal to the z-direction.

There may be provided a separate complete interferometer system, or the original interferometer system may be provided with additional parts, such as beam splitters, additional measuring mirrors etc. As soon as a displacement in the one or more other directions, including possible rotations or tilts, are known, it is a straightforward mathematical exercise to determine corrections to the z-displacement, and hence a more accurate z-displacement. Some examples, such as appropriate linear combinations of measured displacements, will be discussed in the description of preferred embodiments.

Preferably, the laser beam generator system is capable of providing at least one additional measuring laser beam and at least one additional reference laser beam for determining an additional displacement of the holder. Having at least one additional measuring laser beam allows determination of at least two displacements at the same time. However, consecutive measurements are not excluded.

Advantageously, said measuring laser beam and said at least one additional measuring laser beam are substantially parallel and incident on said measuring mirror. One advantageous example of having more than one measuring laser beam is one wherein a displacement of a measuring mirror is determined by means of two parallel and non-coincident measuring laser beams; preferably three parallel and non-coincident measuring laser beams. Measuring with two measuring laser beams allows determination of absolute displacement of a point of the measuring mirror and a tilt around one axis. Measuring with three measuring laser beams not in one plane, allows a determination of the precise displacement and tilt around two optical axis.

In an advantageous embodiment of the lithographic apparatus, the interferometer system comprises an additional measuring mirror with a fixed position with respect to said holder and having an additional mirror surface, an additional normal to which makes a non-zero acute angle with said z-direction, the at least one additional measuring laser beam being incident on said additional measuring mirror in a direction substantially parallel to said additional normal. This offers the possibility of performing a determination of the z-displacement by a method according to the present invention on both sides of the object, or holder, allowing a more accurate measurement. Advantageously, the interferometer system is constructed for providing a measuring laser beam to each of said mirrors simultaneously, although consecutive measurements are not excluded. Preferably, said mirrors are positioned mirror-symmetrically with respect to a axis of symmetry of the holder that runs parallel to the z-direction.

In another embodiment, the interferometer system is constructed for additionally determining an x-displacement, wherein the object or the holder comprise an x-measuring mirror perpendicular to the x-direction, wherein an x-measuring laser beam generator is constructed for providing an x-measuring laser beam to said x-measuring mirror. Preferably, a distance between a line coincident with an optical axis of said x-measuring laser beam and the optical axis is less than 20 mm. This allows a precise determination of x-displacement. This may be combined with a precise z-displacement, e.g. in combination with two opposite z-measuring mirrors. This and other embodiments will be further exemplified in the description of the preferred embodiments.

In a further aspect of the invention, there is provided a device manufacturing method, comprising providing an object in a movable holder, and illuminating said object with abeam of radiation, having an optical axis in the z-direction, using a projection system, wherein said object is moved during at least part of the illuminating, wherein a z-displacement of the object is determined using the method according to the first aspect of the invention.

Furthermore this aspect provides a device manufacturing method, comprising providing a lithographic apparatus according to the invention, fixing an object in the holder, illuminating said object with a beam of radiation using a projection system, wherein said object is moved during at least part of the illuminating, wherein a z-displacement of the object is determined using the interferometer system of said lithographic apparatus.

Herein, moving the object comprises not only a continuous movement during illumination of the object, such as in scanning lithography. Stepwise illumination also entails movement of the object, since different parts of the object are illuminated during different parts of the total illumination.

Both aspects offer the advantage of manufacturing a device, in particular a semiconductor device, with improved quality, since the methods allow the use of larger diameter projection lenses and/or air showers with improved homogeneity. These devices may have a better quality in that details of lithographical structures are smaller or e.g. more homogeneous, and they may have e.g. a lower price, since the improved homogeneity of the air shower allows reduction of a reject rate.

Advantageously, during at least a part of the illuminating of the object, the optical axis of the beam of radiation is outside the object in the holder. The present method for determining z-displacement is independent of a beam striking the object, and hence allows such large shifts in position, in particular in directions perpendicular to the z-direction, that the optical axis of the beam of radiation, in particular a patterned projection beam of radiation, no longer strikes the object to be illuminated. This may still be useful, e.g. in cases where the full surface of the object is to be illuminated, contrary to the case in which only a pattern of projections of e.g. patterning means is projected onto the object, leaving peripheral parts of the surface unilluminated. In some known z-displacement or z-position determining systems, a beam is used which strikes the surface of the object, which system is rendered useless when the optical axis of the beam is outside the object. Contrarily, the present system uses only a reflector with a fixed position with respect to the holder of the object, allowing said optical axis to lie outside the object. In particular, the lithographic apparatus according to the invention comprises two stages. One stage is a stage for illuminating an object, as already described, and using (an interferometer system constructed to use) the method for determining z-displacement according to the invention. Another stage, in which the object will be placed first, is a stage for determining a surface property using a beam, in which stage a roughness map, or in other words a map of z as function of x-y position, of the object may be determined, either with or without using the method for determining z-displacement according to the invention. This map information may be used in the illumination stage. Herein, the correct z-position of the object for illumination is set, using the system and/or method for determining z-displacement according to the invention, as well as a z-reference. This allows simple setting of a z-position by means of a feed-forward signal, instead of first having to determine a z-displacement/z-position and feeding this signal back to the illumination system.

In some known systems it is necessary to first position the optical axis of the beam of radiation on the object before an illumination may start. With the present method, illumination may start when the optical axis of the beam of radiation is outside the object, by using the method described above.

BRIEF DESCRIPTION OF DRAWINGS

The invention will now be elucidated further by means of a number of exemplary and non-limiting preferred embodiments, with reference to the drawings, in which.

DETAILED DESCRIPTION

Lithographic Apparatus

Figure 1A:
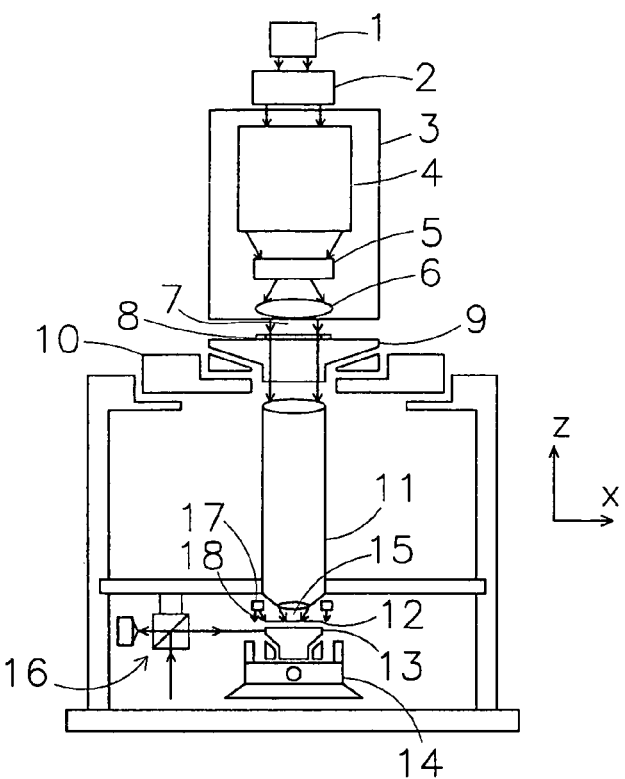
FIGS. 1a and 1b show diagrammatical lithographic apparatus of a transmissive type, a reflective type, respectively.
Figure 1B:
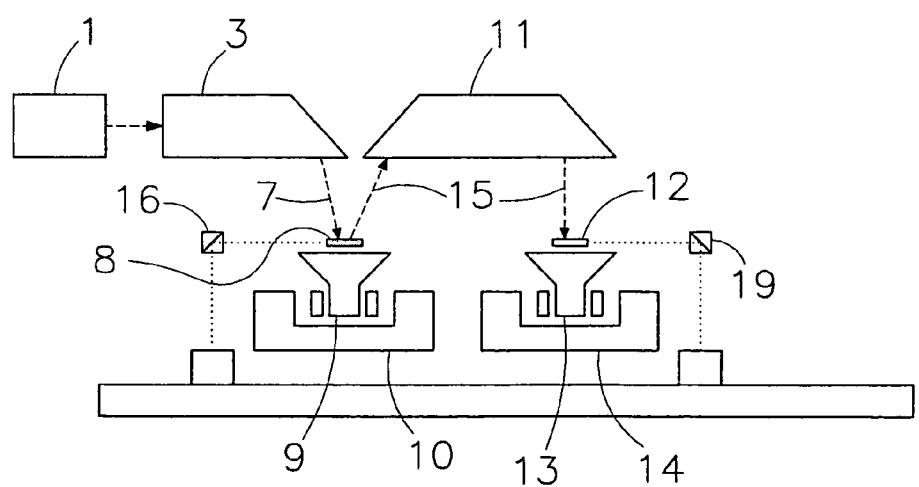

FIGS. 1a and 1b illustrate lithographic apparatus of a transmissive type, and a reflective type, respectively. FIG. 1a schematically depicts a lithographic apparatus of a transmissive type. The apparatus comprises:

an illumination system (illuminator) 3 for providing a projection beam 7 of radiation (e.g. UV radiation);

a first support structure (e.g. a mask table) 9 for supporting patterning means 8, e.g. a mask, and connected to first or mask positioning mechanism 10 for accurately positioning the patterning means with respect to item 11;

a substrate table (e.g. a wafer table) 13 for holding a substrate (e.g. a resist-coated wafer) 12 and connected to second positioning mechanism 14 for accurately positioning the substrate with respect to item 11; and a projection system (e.g. a refractive projection lens) 11 for imaging a pattern imparted to the projection beam 7 by patterning means 8 onto a target portion (e.g. comprising one or more dies) of the substrate 12.

As here depicted, the apparatus is of a transmissive type (e.g. employing a transmissive mask). Alternatively, the apparatus may be of a reflective type (e.g. employing a programmable mirror array of a type as referred to above), see FIG. 1b.

The illuminator 3 receives a beam of radiation from a radiation source 1. The source and the lithographic apparatus may be separate entities, for example when the source is an excimer laser. In such cases, the source is not considered to form part of the lithographic apparatus and the radiation beam is passed from the source 1 to the illuminator 3 with the aid of a beam delivery system 2 comprising for example suitable directing mirrors and/or a beam expander. In other cases the source may be integral part of the apparatus, for example when the source is a mercury lamp. The source 1 and the illuminator 3, together with the beam delivery system 2 if required, may be referred to as a radiation system.

The illuminator 3 may comprise adjusting means 4 for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator 3 generally comprises various other components, such as an integrator 5 and a condenser 6. The illuminator provides a conditioned beam of radiation, referred to as the projection beam 7, having a desired uniformity and intensity distribution in its cross-section.

The projection beam 7 is incident on the mask 8, which is held on the mask table 9. Having traversed the mask 8, the projection beam 7 passes through the lens 11, which focuses the beam onto a target portion of the substrate 12. With the aid of the second positioning mechanism 14 and wafer position sensor 16 (e.g. an interferometric device), the substrate table 13 can be moved accurately, e.g. so as to position different target portions in the path of the beam 7. Similarly, the first positioning mechanism 10 and another position sensor, which is not explicitly depicted in FIG. 1a, but will be explained in subsequent Figures, can be used to accurately position the mask 8 with respect to the path of the beam 7, e.g. after mechanical retrieval from a mask library, or during a scan. In general, movement of the object tables 9 and 13 will be realized with the aid of a long-stroke module (coarse positioning) and a short-stroke module (fine positioning), which form part of the positioning mechanism 10 and 14. However, in the case of a stepper (as opposed to a scanner) the mask table 9 may be connected to a short stroke actuator only, or may be fixed. Mask 8 and substrate 12 may be aligned using mask alignment marks and substrate alignment marks.

The depicted apparatus may be used in the following preferred modes:

step mode: the mask table 9 and the substrate table 13 are kept essentially stationary, while an entire pattern imparted to the projection beam is projected onto a target portion in one go (i.e. a single static exposure). The substrate table 13 is then shifted in the X and/or Y direction so that a different target portion can be exposed. In step mode, the maximum size of the exposure field limits the size of the target portion imaged in a single static exposure.

scan mode: the mask table 9 and the substrate table 13 are scanned synchronously while a pattern imparted to the projection beam is projected onto a target portion (i.e. a single dynamic exposure). The velocity and direction of the substrate table 13 relative to the mask table 9 is determined by the (de-)magnification and image reversal characteristics of the projection system 11. In scan mode, the maximum size of the exposure field limits the width (in the non-scanning direction) of the target portion in a single dynamic exposure, whereas the length of the scanning motion determines the height (in the scanning direction) of the target portion.

other mode: the mask table 9 is kept essentially stationary holding a programmable patterning means, and the substrate table 13 is moved or scanned while a pattern imparted to the projection beam is projected onto a target portion. In this mode, generally a pulsed radiation source is employed and the programmable patterning means is updated as required after each movement of the substrate table 13 or in between successive radiation pulses during a scan. This mode of operation can be readily applied to maskless lithography that utilizes programmable patterning means, such as a programmable mirror array of a type as referred to above.

Combinations and/or variations on the above described modes of use or entirely different modes of use may also be employed.

FIG. 1b schematically depicts a lithographic apparatus of a reflective type. The apparatus is generally similar to the apparatus of FIG. 1a. Here, as well as throughout the rest of the application, similar parts are denoted by similar reference numerals, but the mask 8 will be of a reflective type, with corresponding paths of projection beam 7 and patterned beam 15. Furthermore, the "projection lens" 11 may comprise (concentrical) mirrors, etc.

Note also that the positions of the mask 8 and the wafer 12 are determined by means of a mask position sensor 19 and a wafer position sensor 16, respectively. Both sensors may be interferometric devices according to the invention.

Figure 2:
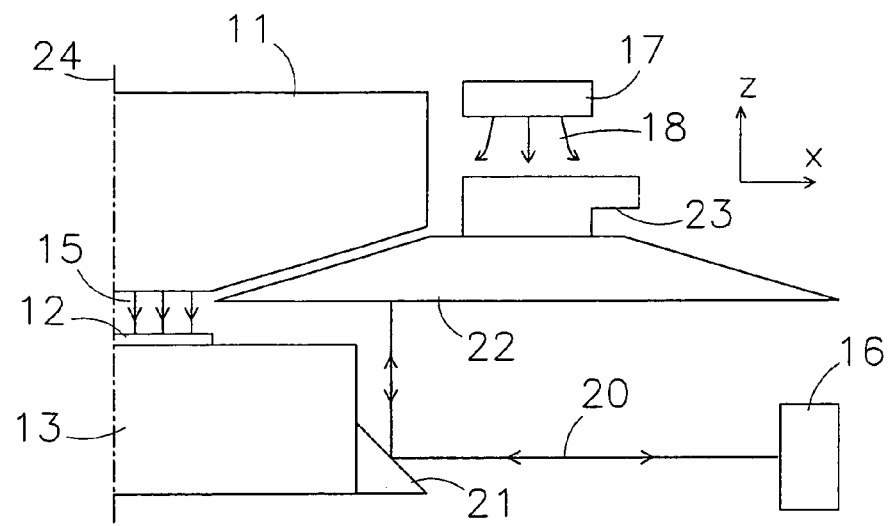
FIG. 2 diagrammatically depicts a detail of a prior art lithographic apparatus.

FIG. 2 diagrammatically depicts a detail of a prior art lithographic apparatus. Herein, 11 denotes a projection lens, projecting a patterned beam 15, having an optical axis 24, onto a substrate wafer 12. The wafer 12 is fixedly connected to wafer table 13.

An interferometric wafer position sensor 16 emits a measuring laser beam 20 towards a 45° mirror 21 which is fixedly connected to wafer table 13. The beam 20 is reflected towards a z reference mirror 22, which is connected to a frame 23.

Air conditioning means 17 eject an air flow 18. This air flow (shown only diagrammatically) is intended to flow as homogeneously as possible around especially the wafer 12 and the patterned beam 15. As can be seen, the air flow 18 is hindered by the presence of the z reference mirror, which has to have a certain length in x-direction in order to be able to reflect the measuring beam when the wafer table 13 is displaced with respect to the beam 15. Furthermore, the dimensions and shape of the projection lens 11, and thus its optical performance, are also limited by the presence of the z-reference mirror 22. Hence the need for an improved apparatus without such z reference mirror close to the projection system/in the air flow can be seen.

It will be appreciated that a z reference mirror "below" the wafer table 13 is not often a real option, since in practical lithographic apparatus the space below said wafer table is packed with various equipment, such as motors for the wafer table 13 and so on. Furthermore, the air flow 18 would still be obstructed.

EMBODIMENTS

Figure 3:
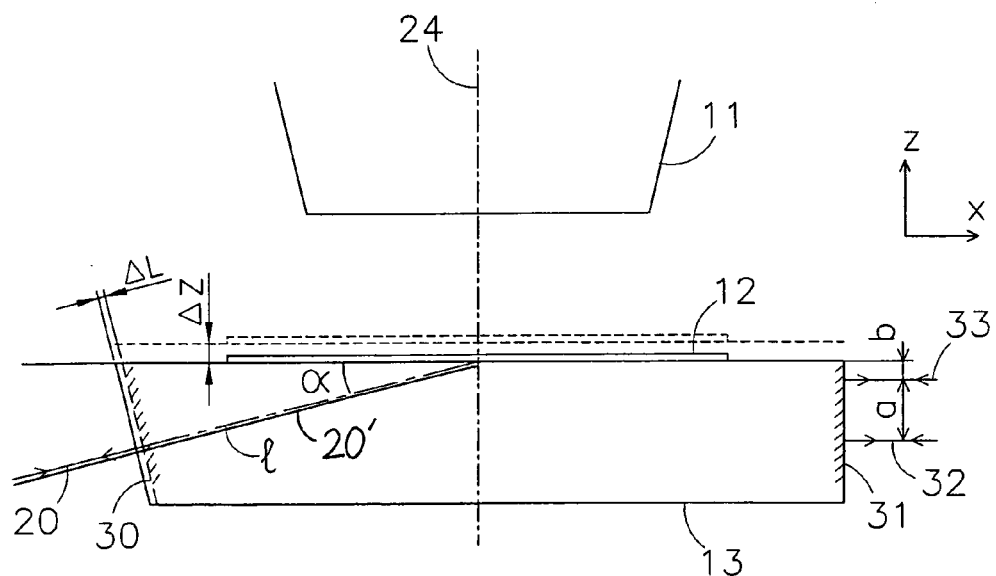
FIG. 3 shows a first diagrammatical embodiment of a detail of a lithographic apparatus, according to the invention, in two different positions.

FIG. 3 shows a first diagrammatical embodiment of a detail of a lithographic apparatus, according to the invention, in two different positions, drawn in solid lines and dashed lines, respectively.

Herein, reference numeral 11 indicates a projection lens, having an optical axis 24. A wafer 12 is fixed to a wafer table 13. A measuring laser beam 20 is directed perpendicularly to a measuring mirror 30, which is secured to wafer table 13. An x measuring mirror 31 is also secured to wafer table 13, in which a first x measuring laser beam 32 and a second x measuring laser beam 33 are directed.

Measuring beam 20 is directed under an angle $\alpha$ with the x-y plane, and towards the intersection of the optical axis 24 with the surface of wafer 12, which is to be illuminated, as illustrated by line 1 which is coincident with an optical axis of the measuring laser beam 20. At least one additional measuring beam 20' are substantially parallel to measuring beam 20 and are incident on measuring mirror 30. When positioned correctly, the surface of the wafer 12 is in the focal plane of the beam of radiation, and the measuring laser beam is directed towards the intersection of the optical axis of the beam of radiation and the focal plane, now at least locally coinciding with the surface of the wafer.

All the above relates to a first position, which is depicted in solid lines. A second position of the wafer table 13 and wafer 12 is depicted in dashed lines. Various changed dimensions have been indicated in the Figure, such as a $\Delta z$, and a $\Delta L$.

Note that the shape of the projection lens 11 may now be chosen freely, as compared to the system of FIG. 2, and that any air flow, though not shown, would not be obstructed by any mirror in its path.

In the FIG. 3, the dashed image relates to a translation in positive z-direction. In this case, the x measuring mirror 31 is imaged onto itself. Both x measuring laser beams 32 and 33 do not measure any change.

However, when there is a displacement in z-direction, $\Delta z$ may be determined according to $$\Delta z = \Delta L / \sin \alpha'$$

wherein $\Delta L$ is the measured displacement in the direction of the measuring laser beam, and $\alpha'$ is the angle between the direction of the measuring laser beam 20 and the x-y plane.

Note that $\alpha'$ substantially corresponds to $90° - \alpha$, as $\alpha$ is the angle between the normal to the measuring mirror and the z-direction, and the measuring laser beam substantially has the same direction as the normal to the measuring surface (in this case) while the z-direction is perpendicular to the x-y plane.

In a practical case, it will be possible to displace the wafer (table) not only in the z-direction, but also in the x-direction, e.g. over a distance $\Delta x$, which may be measured by means of e.g. a linear combination of x measuring laser beams 32 and 33. The z displacement as a function of measured displacement $\Delta L$ and $\Delta x$ now becomes:

$$\Delta z = (\Delta L - \Delta x * \cos \alpha') / \sin \alpha'.$$

As will be appreciated, measuring two $\Delta x$ displacements by means of two x measuring laser beams 32 and 33 gives the opportunity to correct for a tilt around a y-axis, which is perpendicular to both x-axis and z-axis. It will be appreciated that determining further displacements or corrections may be performed by measuring with more laser beams at more positions.

Figure 4B:
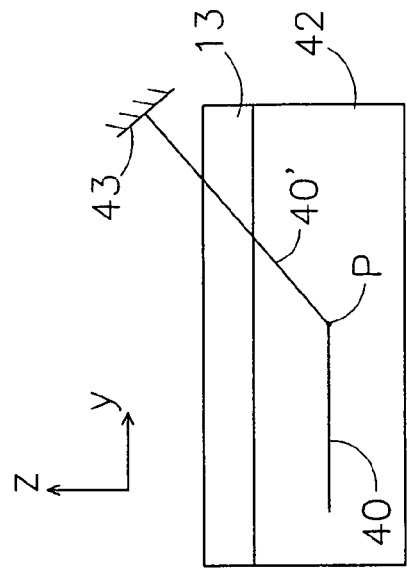
FIGS. 4a and 4b show a side view and a front view of a detail of another embodiment of the lithographic apparatus according to the invention.
Figure 4A:
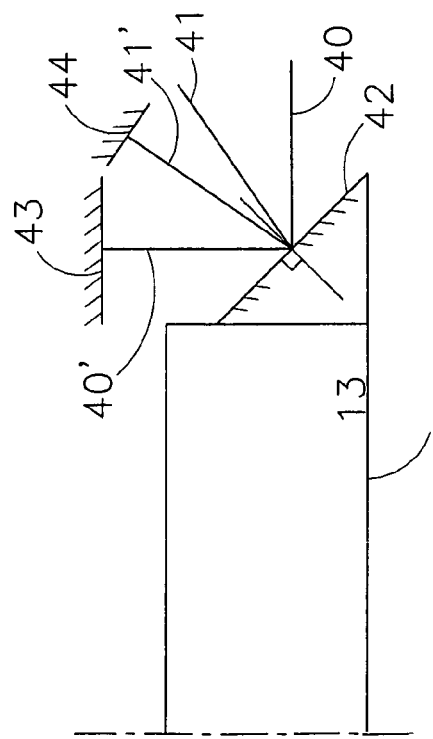

FIGS. 4a and 4b show a side view and a front view of a detail of another embodiment of the lithographic apparatus according to the invention. Again, similar parts are denoted by the same reference numerals.

FIG. 4a shows two measuring laser beams 40 and 41, both incident on a conventional 45° mirror 42 fixed to a wafer table 13. Two separate mirrors 43 and 44 reflect the beams 40 and 41.

Measuring laser beam 40 is incident in an x-y plane, but makes an angle $\beta$ with the plane of the mirror 42, which is smaller than 45°. Hence, beam 40 is incident obliquely, or somewhat "from the left" or "from the right". Note that, for this reason, the angle $\beta$ has not been indicated in the Figure. The beam 40 and the reflected beam 40' will hence not lie in a plane that is parallel with the z-axis. This may be seen in FIG. 4b, where beam 40 is e.g. incident horizontally and coming "from the left", and is reflected going "to the right" and upwards, but not vertically upwards. In this way it is ensured that the beams 40 and 40' can move away from the optical axis 24, possible air flows and/or projection beam (not shown).

Another measuring laser beam 41 and its reflected beam 41' are, but need not be, in a plane parallel with the z-axis. However, beam 40 is not incident horizontally, but under an angle to the normal to the mirror 42 which is smaller than 45°. Hence the reflected beam 41' will not point upwards, again ensuring that the beam(s) may move away from the optical axis, etc.

FIG. 4b shows a front view of the embodiment, with only the laser beams 40 and 40' depicted for clarity. Laser beam 40 is incident on mirror 42 at point P, and reflected as laser beam 40'. As can be seen in this Figure, neither laser beam 40 nor reflected laser beam 40' will be parallel with the z-direction, even though incident laser beam 40 is in an x-y plane and is incident on a 45° mirror.

Figure 5:
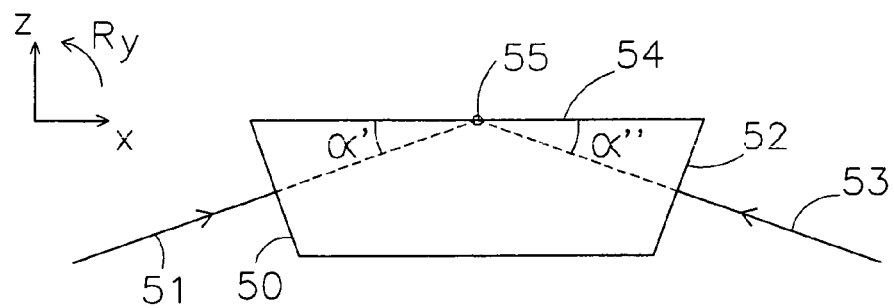
FIG. 5 shows a detail of another advantageous embodiment.

FIG. 5 shows another advantageous embodiment. Herein, 50 denotes a first measuring mirror, 51 is a first measuring laser beam directed under an angle α' with respect to the x-y plane, 52 is a second measuring mirror, and 53 is a second measuring laser beam directed under an angle α" with respect to the x-y plane. A surface to be illuminated is denoted 54, while a focus point is denoted with 55.

In this Figure, as well as all the following, only a holder is shown, it being understood that an object present thereon would cause the plane to be illuminated, i.e. 54, and of course the focus point, to be shifted to the corresponding part of that object. For clarity reasons, this has been omitted here.

In FIG. 5, beam 51 makes an angle α' with the x-y plane, and beam 53 makes an angle α" with the x-y plane, in each case the beam being incident perpendicularly with respect to the corresponding mirror 50, 52, respectively. Both angles α' and α" may be equal, though they need not be. Furthermore, both beams 51 and 53 are directed towards the focus point, the intersection of the focus plane and the optical axis of the beam of radiation (not shown). This means that the Abbe-arm for both beams is substantially zero. Both beams may however also be directed off-axis, although then an Abbe-error should be taken into account. The present embodiment offers increased accuracy when measuring z-displacement.

Figure 6:
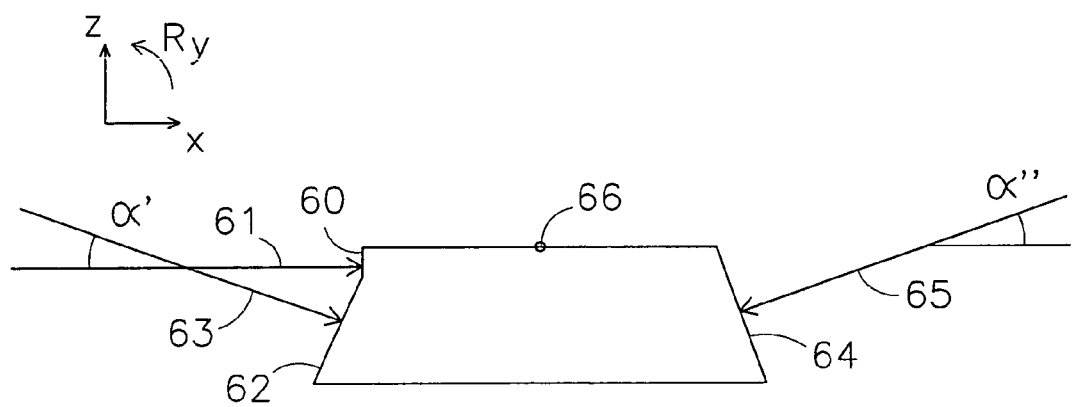
FIG. 6 shows a detail of yet another embodiment of the invention.

FIG. 6 shows another embodiment of the invention. An x-measuring mirror is denoted by 60, 61 is an x-measuring laser beam, 62 is a first z-measuring mirror, 63 is a first z-measuring laser beam directed under an angle α' with respect to the x-y plane, 64 is a second z-measuring mirror, and 65 is a second z-measuring laser beam directed under an angle α" with respect to the x-y plane. The focus point is indicated by 66. In this Figure, mirrors 60 and 62 may be two separate mirrors or one continuous though curved/bent mirror surface.

Mirror 60 and laser beam 61 are used to measure a displacement in x-direction. Thereto, laser beam 61 is directed substantially parallel to the x-axis.

Again, angles α' and α" may be equal, but need not be. Although both laser beams point away from the focus point 66, and hence the Abbe arm of said beams is large, i.e. the distance between the focus point and the laser beam is large, the net effective Abbe error turns out to be small. This will be elucidated in FIG. 8.

Figure 7:
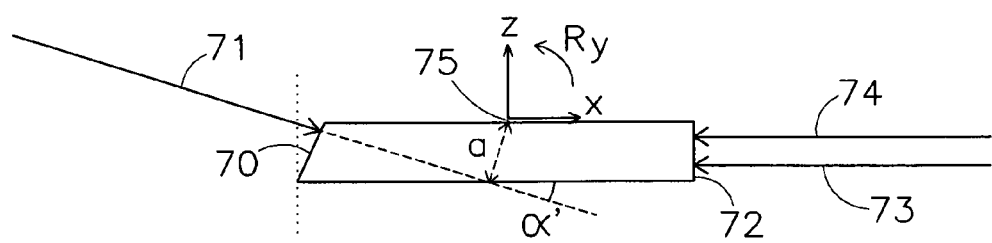
FIG. 7 shows a detail of another embodiment of the invention.

FIG. 7 shows another embodiment of the invention. Herein, 70 is a z-measuring mirror, 71 is a z-measuring laser beam, 72 is an x-measuring mirror, 73 and 74 are a first, a second x-measuring laser beam, respectively, and 75 is a focus point.

Mirror 72 and laser beams 73 and 74 may be used to measure not only displacement in x-direction, but also a rotation around a y-direction, according to well known interferometry techniques not further discussed here. The z-measuring laser beam 71 is directed under an angle α' with respect to the x-y plane, and has an Abbe-arm with length a, as indicated in the Figure. This embodiment has a large Abbe-error, since the Abbe-arm is large, and thus every rotation around a y-direction will cause a large deviation in the measurement of z-displacement. If one is able to take this into account, e.g. by accurate measurements with beams 73 and 74, this need not be a problem, but an embodiment in which the beam 71 is directed towards the focus point is normally preferred.

Figure 8:
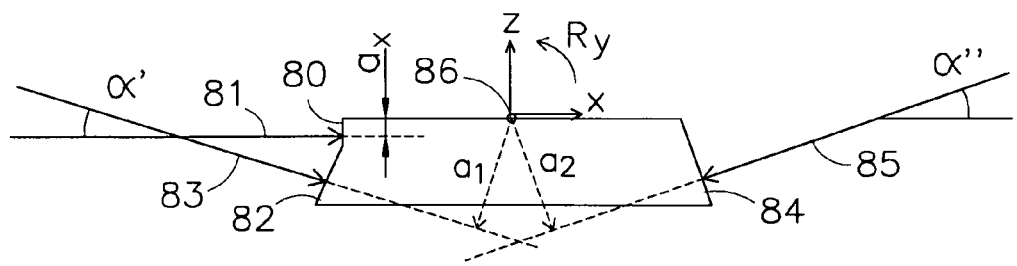
FIG. 8 illustrates some accuracy considerations relating to the embodiment shown in FIG. 6.

FIG. 8 illustrates some accuracy considerations relating to the embodiment shown in FIG. 6. The reference numerals correspond to those of FIG. 6 when decreased by a value of 20, e.g. the focus point 86 in FIG. 8 corresponds to focus point 66 in FIG. 6. As indicated in the Figure, the Abbe-arm of laser beam 81, which runs parallel to the x-axis, is $a_x$.

First z-measuring laser beam 83 has an Abbe-arm a1 with respect to the focus point 86, while second z-measuring laser beam 85 has an Abbe-arm a2 with respect to the focus point 86. Arms a1 and a2 may be equal, but need not be.

To illustrate that in this case large Abbe-arms need not cause large errors when calculating a z-displacement, consider the following. The z-displacement may be calculated by a suitable linear combination of a measured displacement D1 in the direction of beam 83 and a measured displacement D2 in the direction of beam 85. In the case that α'=α", this becomes $(-D1-D2)/(2 \sin \alpha')$, where the minus sign comes from the beams pointing in the negative z-direction.

Note that D1 and D2 are measuring results, which need not correspond directly to physical displacements. Part of the displacement may be due to a shift of the beam(s) over the mirror surface.

The Abbe-error for beam 83 is a1*Ry, in which Ry is an unknown rotation angle around the y-axis, which rotation has been indicated in the Figure. Similarly, the Abbe-error for the beam 85 is −a2*Ry. The total z-error due to the Abbe error is $$(-a1*Ry+a2*Ry)/(2*\sin(\alpha')).$$

So there are possible combinations of α' (or more generally of α' and α2, if they are not equal), a1, and a2 where there is no net error in the z-determination due to the Abbe arm, e.g. when α'=α" and a1=a2. Other combinations are also possible. Even if there is a resulting net error in z due to Abbe arms, this error will in this setup likely be small compared to e.g. the embodiment of FIG. 7.

Another advantage of this embodiment is that the Ry angle can be determined accurately. This can be seen by considering the fact that another measurement, a pseudo-x measurement, can be done by subtracting D2 from D1 and dividing the difference by 2*cos(α'), again assuming that α'=α". This pseudo-x measurement has a relatively long Abbe arm of (a1+a2)/2, and can be compared with a single x axis measurement at (a1+a2)/(2*cos(α')) below the focus point.

Therefore the difference between the pseudo x-axis and a measurement along x measuring beam 81 gives a measure of Ry which is accurate compared to a calculation on the basis of the difference of two measurements along the x-axis, at different heights, such as e.g. shown in FIG. 7 the beams 73 and 74. In comparison to the pseudo-x measurement, these are placed relatively close to each other. In other words, in the embodiment of FIG. 8, use is made of two measurements D1 and D2, each with a considerable Abbe-arm, but such that the Abbe-arms increase accuracy when determining Ry, while the Abbe-error due to the Abbe-arms may yet be made small when determining z-displacement.

Mathematically x, z, and Ry can be determined by solving the following equations:

$$X1 = x + a_x Ry$$

$$D1 = \cos(\alpha')*x - \sin(\alpha')*z + a1*Ry$$

$$D2 = -\cos(\alpha'')*x - \sin(\alpha'')*z - a2*Ry,$$

where
X1 is the measured displacement along beam 83,
x is the actual displacement in x-direction,
$a_x$ is the Abbe-arm of laser beam 83,
Ry is the actual rotation around the y-axis,
D1, D2 is the measured displacement along beam 83, beam 85, respectively,
α′, α″ is the angle between the x-y plane and beam 83, beam 85, respectively,
a1, a2 is the Abbe-arm of beam 83, beam 85, respectively, and
z is the actual displacement in z-direction.
This gives:

$$x = \frac{(a2\sin(\alpha') + a1\sin(\alpha''))X1 - a_x D1\sin(\alpha'') + a_x D2\sin(\alpha')}{-a_x \sin(\alpha' + \alpha'') + a2\sin(\alpha') + a1\sin(\alpha'')}$$

$$z = \frac{(a2\cos(\alpha') - a1\cos(\alpha''))X1 + (a_x \cos(\alpha'') - a2)D2 + (a_x \cos(\alpha') - a1)D2}{-a_x \sin(\alpha' + \alpha'') + a2\sin(\alpha') + a1\sin(\alpha'')}$$

$$Ry = \frac{-X1\sin(\alpha' + \alpha'') + D1\sin(\alpha'') - D2\sin(\alpha')}{-a_x \sin(\alpha' + \alpha'') + a2\sin(\alpha') + a1\sin(\alpha'')}$$

In other situations, the skilled person will have no difficulty in finding the corresponding equations with which the values for x, z and/or Ry may be readily determined.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A method of determining the displacement of an object in an apparatus along a z-direction, said method comprising:
   providing a reference laser beam;
   providing a measuring laser beam that is directed substantially perpendicularly incident on a measuring mirror with a fixed position relative to said object such that a reference line normal to the measuring mirror makes a non-zero acute angle with said z-direction, said measuring laser beam being substantially retro-reflected and at least partly overlapping said reference beam to provide an interference signal, the object to be illuminated by a beam of radiation having an optical axis extending along the z-direction;
   determining a change in said interference signal;
   processing said change in order to determine the displacement of said object along the z-direction; and
   supplying or making available the determined displacement for further analysis or processing.

2. A method of determining the displacement of an object in an apparatus along the z-direction, said method comprising:
   providing an interferometer system comprising:
      a laser beam generator system configured to generate at least one reference laser beam and at least one measuring laser beam;
      at least one mirror, wherein said at least one mirror includes a measuring mirror with a fixed position relative to said object and having a mirror surface in which a reference line normal to the mirror surface makes a non-zero acute angle with said z-direction, the object having a surface that extends substantially in a plane perpendicular to the z-direction, the surface of the object to be illuminated by a beam of radiation having an optical axis extending along the z-direction;
      an interference signal processing system configured to receive an interference signal produced by said reference laser beam and said measuring laser beam, and to determine said displacement based on a change in said interference signal;
   providing said reference laser beam and said measuring laser beam such that said measuring laser beam is directed towards said measuring mirror in a direction substantially perpendicular to said mirror surface and said measuring laser beam is substantially retro-reflected by said measuring mirror to at least partly overlap said reference beam to generate said interference signal;
   determining a change in said interference signal;
   processing said change in order to determine the displacement of said object along the z-direction; and
   supplying or making available the determined displacement for further analysis or processing.

3. The method of claim 2, wherein said measuring mirror is arranged such that said normal to said measuring mirror contains an angle α with respect to the z-direction, wherein α is between approximately 60° and about 87°.

4. The method of claim 2, wherein said measuring mirror is arranged such that said normal to said measuring mirror contains an angle α with respect to the z-direction, wherein α is between approximately 75° and 85°.

5. The method of claim 2, wherein said measuring laser beam is directed such that a distance between a point where said optical axis of the beam of radiation intersects said surface of said object and a line coincident with an optical axis of a part of said measuring laser beam that is incident on said measuring mirror is less than 6 mm.

6. The method of claim 2, wherein at least one additional displacement is determined and said interference signal processing system uses said additional displacement to determining the displacement of said object in the z-direction.

7. A method of determining the displacement of an object in an apparatus along the z-direction, said object having a surface which extends substantially in a plane perpendicular to said z-direction and which is illuminated by a beam of radiation having an optical axis extending along the z-direction, said method comprising:
- providing an interferometer system, comprising:
  - a laser beam generator system arranged and constructed for generating at least one reference laser beam and at least one measuring laser beam;
  - a set of at least two mirrors comprising at least one mirror which is a measuring mirror fixedly connected to said object and having a mirror surface in which a reference line normal to the mirror surface makes a non-zero acute angle with said z-direction and at least one separate mirror having a fixed position with respect to said apparatus;
  - an interference signal processing system, arranged and constructed for receiving an interference signal produced by said reference beam and said measuring beam and for determining a displacement on the basis of a change in said interference signal;
- providing said reference laser beam and said measuring laser beam, wherein said measuring laser beam has a direction of incidence on the measuring mirror outside a plane in which the z-direction and said normal to said mirror surface lie and is directed towards said measuring mirror such that said measuring laser beam is reflected by said measuring mirror towards said separate mirror in a direction substantially perpendicular to said separate mirror and at least partly overlaps said reference laser beam to provide an interference signal;
- determining a change in said interference signal;
- processing said change in said interference signal in order to determine said displacement in the z-direction; and
- supplying or making available the determined displacement for further analysis or processing.

8. A lithographic apparatus, comprising:
- a projection system configured to provide a beam of radiation for illuminating an object, said beam of radiation having an optical axis in a z-direction;
- a movable holder configured to hold said object; and
- an interferometer system configured to determine a displacement of said object along a z-direction, said interferometer system comprising:
  - a laser beam generator system configured to generate at least one reference laser beam and at least one measuring laser beam;
  - at least one mirror, wherein said at least one mirror includes a measuring mirror with a fixed position relative to said object and having a mirror surface in which a reference line normal to the mirror surface makes a non-zero acute angle with said z-direction; and
  - an interference signal processing system configured to receive an interference pattern based on said reference laser beam and said measuring laser beam and to determine said displacement based on a change in said interference signal,
  - wherein said normal to said mirror surface is substantially parallel to a direction of incidence of said measuring laser beam on said mirror surface.

9. The lithographic apparatus of claim 8, further comprising a holder mover system configured to move said holder, wherein said holder mover system is operatively connected to said interferometer system.

10. The lithographic apparatus of claim 9, wherein said holder mover system is at least controlled by said interferometer system when moving said holder along the z-direction.

11. The lithographic apparatus of claim 8, wherein said measuring mirror is arranged such that a normal to said measuring mirror contains an angle $\alpha$ with respect to the z-direction, wherein $\alpha$ is between approximately 60° and 87°.

12. The lithographic apparatus of claim 11, wherein said measuring mirror is arranged such that a normal to said measuring mirror contains an angle $\alpha$ with respect to the z-direction, wherein a is between approximately 75° and 85°.

13. The lithographic apparatus of claim 8, wherein said measuring laser beam has a direction such that a distance between a point where the optical axis of said beam of radiation intersects said surface of said object and a line coincident with an optical axis of a part of said measuring laser beam that is incident on said measuring mirror is less than 6 mm.

14. The lithographic apparatus of claim 8, further comprising an additional displacement measuring system configured to determine at least one additional displacement in at least one additional direction, wherein said interference signal processing system has been arranged and constructed to use said additional displacement in determining the displacement of said object in the z-direction.

15. The lithographic apparatus of claim 8, wherein said interferometer system is configured to determine at least one additional displacement, wherein said interference signal processing system is constructed and arranged to convert a combination of said interference signal and said at least one additional displacement into a value for the z-displacement.

16. The lithographic apparatus of claim 8, wherein said laser beam generator system is capable of providing at least one additional measuring laser beam and at least one additional reference laser beam for determining at least one additional displacement of said holder.

17. The lithographic apparatus of claim 16, wherein said measuring laser beam and at least one additional measuring laser beam are substantially parallel and incident on said measuring mirror.

18. The lithographic apparatus of claim 16, wherein said interferometer system further comprises an additional measuring mirror with a fixed position with respect to said holder and having an additional mirror surface, the additional normal reference to which makes a non-zero acute angle with said z-direction, said at least one additional measuring laser beam being incident on said additional measuring mirror in a direction substantially parallel to said additional normal.

19. The lithographic apparatus of claim 18, wherein said measuring mirror and said additional measuring mirror are provided on opposite sides of the holder.

20. A lithographic apparatus, comprising:
- a projection system configured to provide a beam of radiation for illuminating an object, said beam of radiation having an optical axis in a z-direction;
- a movable holder configured to hold said object; and
- an interferometer system configured to determine a displacement of said object along a z-direction, said interferometer system comprising:

a laser beam generator system configured to generate at least one reference laser beam and at least one measuring laser beam;

at least one mirror, wherein said at least one mirror includes a measuring mirror with a fixed position relative to said object and having a mirror surface in which a reference line normal to the mirror surface makes a non-zero acute angle with said z-direction; and an interference signal processing system configured to receive an interference pattern based on said reference laser beam and said measuring laser beam and to determine said displacement based on a change in said interference signal, wherein said measuring laser beam has a direction of incidence on the measuring mirror outside a plane in which the z-direction and said normal to said mirror surface lie, there being provided a separate mirror constructed and arranged for substantially retro-reflecting said measuring laser beam.

21. A device manufacturing method, comprising:

providing an object in a movable holder;

illuminating said object with a beam of radiation having an optical axis in the z-direction;

moving said object during at least part of the illuminating; and determining a displacement of said object along the z-direction by:

providing a reference laser beam;

providing a measuring laser beam that is directed substantially perpendicularly incident on a measuring mirror with a fixed position relative to said object such that a reference line normal to the measuring mirror makes a non-zero acute angle with said z-direction, said measuring laser beam being substantially retro-reflected and at least partly overlapping said reference beam to provide an interference signal;

determining a change in said interference signal;

processing said change in order to determine the displacement of said object along the z-direction; and supplying or making available the determined displacement for further analysis or processing.

22. The device manufacturing method of claim 21, wherein, during at least a part of the illuminating of said object, the optical axis of the beam of radiation is outside said object in said holder.

23. A device manufacturing method, comprising providing a projection system configured to provide a beam of radiation for illuminating an object, said beam of radiation having an optical axis in a z-direction;

providing a movable holder configured to hold said object;

providing an interferometer system configured to determine a displacement of said object along a z-direction, said interferometer system comprising:

a laser beam generator system configured to generate at least one reference laser beam and at least one measuring laser beam;

at least one mirror, wherein said at least one mirror includes a measuring mirror with a fixed position relative to said object and having a mirror surface in which a reference line normal to the mirror surface makes a non-zero acute angle with said z-direction; and an interference signal processing system configured to receive an interference pattern based on said reference laser beam and said measuring laser beam and to determine said displacement based on a change in said interference signal, wherein said normal to said mirror surface is substantially parallel to a direction of incidence of said measuring laser beam on said mirror surface;

securing an object in said holder;

illuminating said object with said beam of radiation;

moving said object during at least part of said illuminating;

wherein the z-displacement of said object is determined based on said interferometer system and said interference signal processing system of said lithographic apparatus; and supplying or making available the determined displacement for further analysis or processing.

24. The device manufacturing method of claim 23, wherein, during at least a part of the illuminating of said object, the optical axis of said beam of radiation is outside said object in said holder.

* * * * *